United States Patent
Abe

(10) Patent No.: US 7,449,931 B2
(45) Date of Patent: Nov. 11, 2008

(54) DUTY RATIO ADJUSTMENT

(75) Inventor: Tsuneo Abe, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 11/465,390

(22) Filed: Aug. 17, 2006

(65) Prior Publication Data
US 2007/0103219 A1    May 10, 2007

(30) Foreign Application Priority Data
Sep. 21, 2005    (JP) ............................. 2005-273606

(51) Int. Cl.
*H03K 3/017*    (2006.01)
(52) U.S. Cl. ...................................... 327/175; 327/172
(58) Field of Classification Search ........................ None
See application file for complete search history.

(56) References Cited

U.S. PATENT DOCUMENTS

| | | | | |
|---|---|---|---|---|
| 5,359,232 A * | 10/1994 | Eitrheim et al. | ............. | 327/116 |
| 5,583,461 A * | 12/1996 | Lowe | .......................... | 327/172 |
| 5,764,091 A * | 6/1998 | Sumita et al. | ................ | 327/175 |
| 6,198,322 B1 * | 3/2001 | Yoshimura | ................... | 327/175 |
| 6,339,553 B1 * | 1/2002 | Kuge | ........................... | 365/194 |
| 6,380,778 B2 * | 4/2002 | Uehara et al. | ................ | 327/175 |
| 6,937,485 B2 * | 8/2005 | Suzuki et al. | ................. | 363/41 |
| 7,019,574 B2 * | 3/2006 | Schrodinger | ................ | 327/175 |

FOREIGN PATENT DOCUMENTS

| | | |
|---|---|---|
| JP | 10-144074 | 5/1998 |
| JP | 2001-307497 | 11/2001 |
| JP | 2004-206879 | 7/2004 |

* cited by examiner

*Primary Examiner*—Cassandra Cox
(74) *Attorney, Agent, or Firm*—Hayes Soloway P.C.

(57) ABSTRACT

There is disclosed a duty ratio adjustment for adjusting the duty ratio of an input clock signal. First and second one-shot pulse generation circuits respectively detect rising/tailing edges of an external input signal and output pulse signals of constant widths. Third and fourth one-shot pulse generation circuits respectively detect rising/tailing edges of an output signal from the delay circuit and output pulse signals. A selector circuit outputs the pulse signals that are output from the third and second one-shot pulse generation circuits as H edge/L edge generation clock signals, when the L width is broadened, and outputs the pulse signals that are output from the first and fourth one-shot pulse generation circuits as H edge/L edge generation clock signals, when the H width is broadened. A waveform synthesis circuit outputs a signal that changes to a high level between the timing during which the high edge generation signal is output from the selector circuit and the timing during which the low edge generation signal is output from the selector circuit, as an internal clock signal.

3 Claims, 5 Drawing Sheets

US 7,449,931 B2

DUTY RATIO ADJUSTMENT

BACKGROUND OF THE INVENTION

1. Field of the Invention

The present invention relates to a semiconductor device that generates and uses an internal clock signal in accordance with a clock signal that is input from the outside.

2. Description of the Related Art

The conventional semiconductor device uses a clock signal input from the outside as an internal clock signal without being processed. Therefore, when the duty ratio of the external input signal is 50%, the duty ratio of the internal clock signal is also 50%. However, as the signal speed becomes faster, there is a possibility that the duty ratio of the external input signal varies from 50%. Nevertheless, it is required that the semiconductor device operates normally in such a case. Therefore, JP-1998-144074A and JP-2004-206879A disclose various semiconductor devices for ensuring room for variation in the clock signal that is input from the outside.

There is a need for a semiconductor device that can normally operate even if the duty ratio of the clock signal, that is input, varies, like this. Therefore, when the operation test for the semiconductor device is performed, it is necessary to perform the test during the time when the duty ratio of the clock test that is input varies.

However, in the conventional semiconductor device, when a simplified measurement device having no function for changing the duty ratio of the clock signal that is generated is used, it is impossible to change the duty ratio of the clock signal that is input from the outside to the semiconductor device and to perform the operation test.

Under this situation, for example, in a module provided with a waveform shaping function, such as PLL (Phase-Locked Loop), the conventional semiconductor device, while changing the duty ratio, cannot test the operation margin of the PLL and the operation margin of an asynchronous circuit.

The conventional semiconductor device has a problem that the operation margin during the time when, while the duty ratio varies, cannot be tested, when not using a measurement device that can change the duty ratio of the clock signal that is supplied.

SUMMARY OF THE INVENTION

The present invention has as an object to provide a semiconductor device that can perform an operation margin test when the duty ratio varies, without changing the duty ratio of the clock signal input from the outside.

According to the present invention, a semiconductor device is provided with a duty ratio adjustment circuit for changing the duty ratio of a clock signal that is input. Therefore, though a waveform is automatically shaped into a duty ratio of 50%, as in a PLL circuit mounted module, or though a simplified measurement device having no function for changing an input duty ratio from 50% is used, a test can be performed while the duty ratio is changed. According to this arrangement, test efficiency can be improved and the types of tests can be increased.

The above and other objects, features, and advantages of the present invention will become apparent from the following description with reference to the accompanying drawings which illustrate an example of the present invention.

DETAILED DESCRIPTION OF THE PREFERRED EMBODIMENTS

A semiconductor device of the present embodiment is provided with a duty ratio adjustment circuit for adjusting the duty ratio of an input clock signal and for outputting the input clock signal as an internal clock signal.

Figure 1:
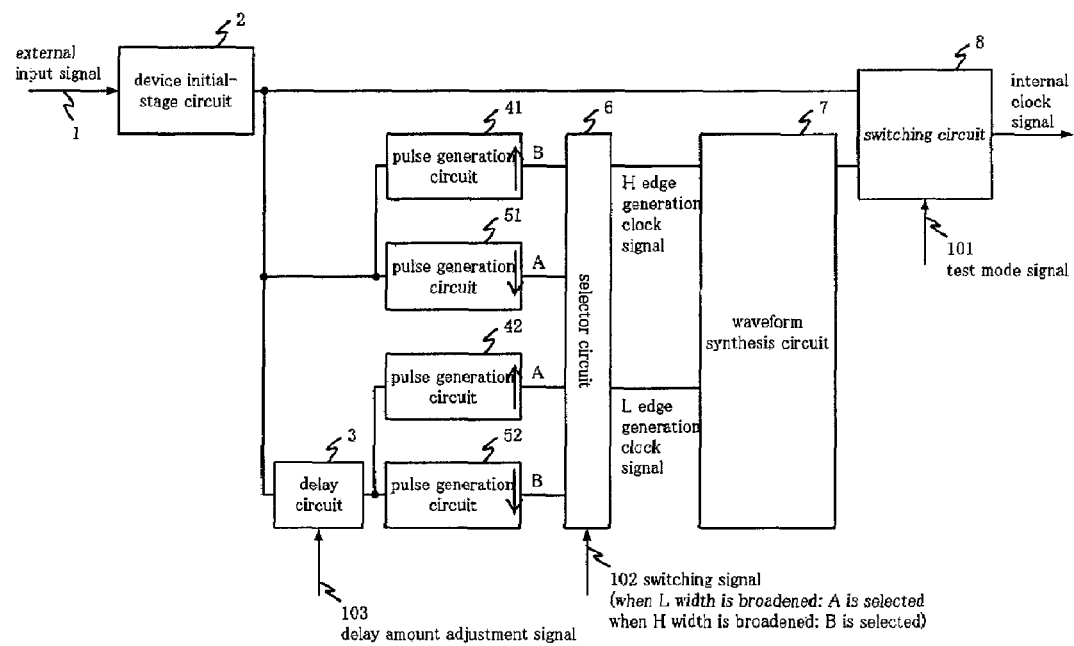
FIG. 1 is a block diagram of a duty ratio adjustment circuit in a semiconductor device according to an embodiment of the present invention.

Referring to FIG. 1, a duty ratio adjustment circuit is provided with device initial-stage circuit 2, delay circuit 3, one-shot pulse generation circuits (hereinafter, called pulse generation circuits) 41, 42, 51, 52, selector circuit 6, waveform synthesis circuit 7, and switching circuit 8.

The duty ratio adjustment circuit of the present embodiment outputs a clock signal, as an internal clock signal, generated in accordance with external input signal 1 that is input.

Device initial-stage circuit 2 functions as an input buffer that receives external input signal 1 and outputs it to another circuit.

Delay circuit 3 outputs external input signal 1 that is input through device initial-stage circuit 2 while delaying external input signal 1 by a preset delay time. Incidentally, the delay time of delay circuit 3 can be adjusted by delay amount adjustment signal 103 that is input from the outside.

Pulse generation circuit 41 is a first one-shot pulse generation circuit for detecting the rising edge of external input signal 1 that is input through device initial-stage circuit 2 and for outputting a pulse signal of a constant width. Pulse generation circuit 51 is a second one-shot pulse generation circuit for detecting the tailing edge of external input signal 1 that is input through device initial-stage circuit 2 and for outputting a pulse signal of a constant width.

Pulse generation circuit 42 is a third one-shot pulse generation circuit for detecting the rising edge of the output signal from delay circuit 3 and for outputting a pulse signal. Pulse generation circuit 52 is a fourth one-shot pulse generation circuit for detecting the tailing edge of the output signal from delay circuit 3 and for outputting a pulse signal.

Figure 2A:
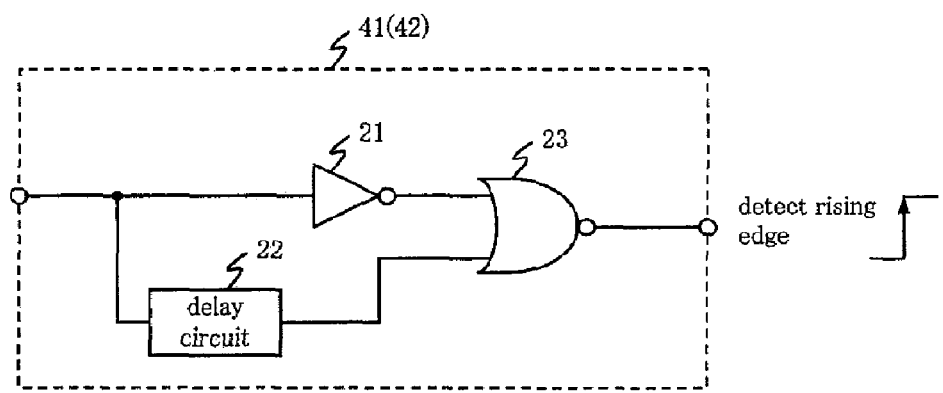
FIG. 2(a) is a view showing a circuit example of a pulse generation circuit shown in FIG. 1.

Each of pulse generation circuit 41, 42 shown in FIG. 1 includes inverter 21, delay circuit 22, and NOR gate circuit 23, as shown in FIG. 2(a). Pulse generation circuit 41 detects the rising edge of the input signal and outputs a pulse, by computing the inverse of the logical OR between an input signal logically inversed by inverter 21 and an input signal that is delayed by delay circuit 22. The pulse width generated by pulse generation circuit 41 is determined by the delay amount of delay circuit 22.

Figure 2B:
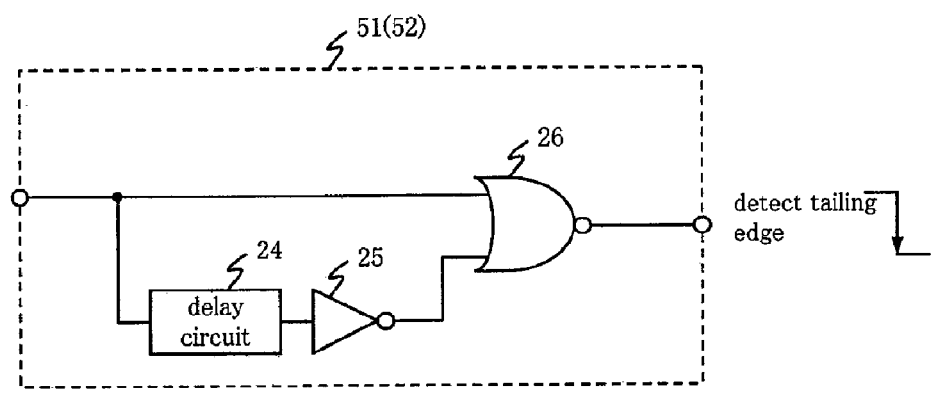
FIG. 2(b) is a view showing a circuit example of a pulse generation circuit shown in FIG. 1.

Each of pulse generation circuit 51, 52 shown in FIG. 1 includes delay circuit 24, inverter 25, and NOR gate circuit 26, as shown in FIG. 2(b). Pulse generation circuit 51 detects the tailing edge of the input signal and outputs a pulse, by computing the inverse of the logical OR between the input signal and the signal, which is delayed the input signal by delay circuit 24 and is logically inverted. The pulse width generated by pulse generation circuit 51 is determined by the delay amount of delay circuit 24.

Selector circuit 6 is used to select whether the width of the low level of an input signal (hereinafter, called L level or L) is broadened or the width of the high level of an input signal (hereinafter, called H level or H) is broadened.

When switching signal 102 instructs that the L width of the input clock signal is broadened, selector circuit 6 outputs the pulse signal output from pulse generation circuit 42 as an H edge generation clock signal and outputs the pulse signal output from pulse generation circuit 51 as a L edge generation clock signal. Also, when switching signal 102 instructs that the H width of the input clock signal is broadened, selector circuit 6 outputs the pulse signal that is output from pulse generation circuit 41 as an H edge generation clock signal and outputs the pulse signal that is output from pulse generation circuit 52 as a L edge generation clock signal.

Waveform synthesis circuit 7 outputs a signal that becomes a high level only between timing during which the H edge generation clock signal is output from selector circuit 6 and timing during which the L edge generation clock signal is output from selector circuit 6, as a new generated clock signal.

Figure 3:
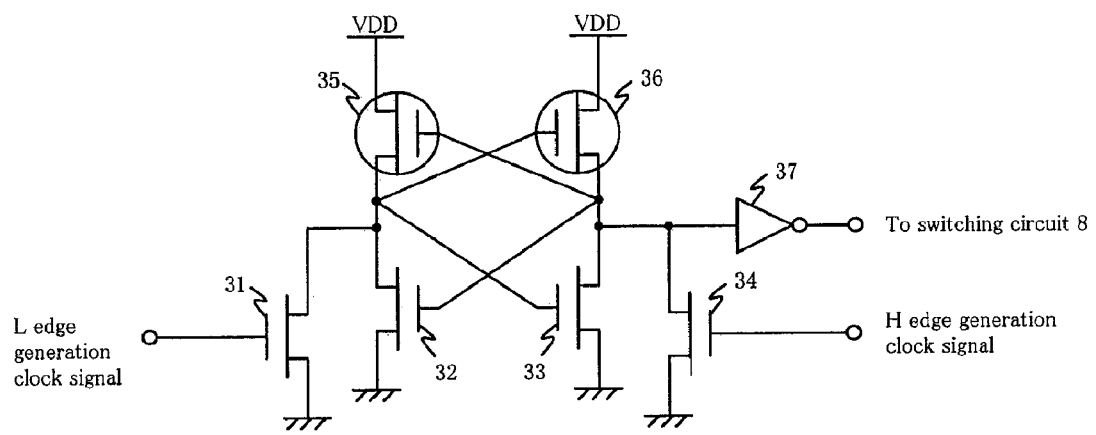
FIG. 3 is a view showing a circuit example of a waveform synthesis circuit shown in FIG. 1.

Waveform synthesis circuit 7 shown in FIG. 1, as shown in FIG. 3, includes N-channel MOS transistors 31 to 34, P-channel MOS transistors 35, 36, and inverter 37. The L edge generation clock signal that is output from selector circuit 6 is input to the gate of N-channel MOS transistor 31. Also, the H edge generation clock signal that is output from selector circuit 6 is input to the gate of N-channel MOS transistor 34. Further, output from inverter 37 is output to switching circuit 8 as a clock signal after duty ratio adjustment.

When the H edge generation clock signal changes to the H level, N-channel MOS transistor 34 is turned ON, the input of inverter 37 changes to the L level, and the output of inverter 37 changes to the H level. At the same time, P-channel MOS transistor 35 is turned ON and the gate of N-channel MOS transistor 33 changes to the H level. Therefore, N-channel MOS transistor 33 is continuously in the ON state, and the input of inverter 37 is maintained at the L level. Therefore, even if the H edge generation clock signal changes to the L level, the output of inverter 37 that is to be output to switching circuit 8 is maintained at the H level.

In this state, when the L edge generation clock signal changes to the H level, N-channel MOS transistor 31 is turned ON, P-channel MOS transistor 36 is turned ON, and N-channel MOS transistor 33 is turned OFF. Therefore, the input of inverter 37 changes to the H level, and the output of inverter 37 changes to the L level. At the same time, N-channel MOS transistor 32 is continuously in the ON state, and the input of inverter 37 is maintained at the H level. Therefore, even if the L edge generation clock signal changes to the L level, the output of inverter 37 that is to be output to switching circuit 8 is maintained at the L level.

Switching circuit 8 is a circuit for switching between a test mode and a usual mode. Switching circuit 8 selects the clock signal from device initial-stage circuit 2 as an internal clock signal when test mode signal 101 indicates the usual mode. Also, switching circuit 8 selects the clock signal from waveform synthesis circuit 7 as an internal clock signal when test mode signal 101 indicates the test mode.

Next, detailed explanations are given of the operation of the duty ratio adjustment circuit according to the present embodiment with reference to drawings. Explanations are given on the assumption that external input signal 1 is a signal having a duty ratio of 50%.

External input signals 1 that are input from the outside pass through device initial-stage circuit 2, and then are divided into signals, which will pass through delay circuit 3, and signals, which will not pass through delay circuit 3. The variation width of the duty ratio is determined by the delay time set by delay circuit 3. Therefore, the delay amount is previously adjusted by using delay amount adjustment signal 103, whereby the variation width of the duty ratio can be changed to a value, at which a test will be performed.

Figure 4:
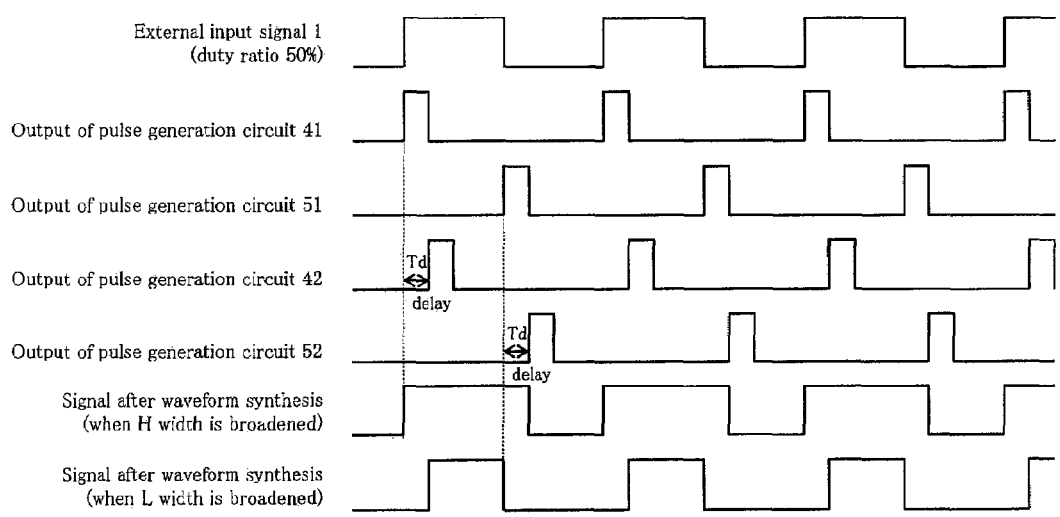
FIG. 4 is a timing chart showing an operation of the duty ratio adjustment circuit according to the embodiment of the present invention.

Subsequently, the clock signal that passes through device initial-stage circuit 2 and the clock signal that is delayed by the delay time set by delay circuit 3 are respectively converted into pulse signals by pulse generation circuits 41, 42, 51, 52. As shown in FIG. 4, since the delay time of delay circuit 3 is Td, the pulse signal output from pulse generation circuit 42 is delayed from the pulse signal that is output from pulse generation circuit 41 by time Td. Also, the pulse signal output from pulse generation circuit 52 is delayed from the pulse signal that is output from pulse generation circuit 51 by time Td.

Then, selector circuit 6 selects whether the H width is broadened or the L width is broadened, in accordance with switching signal 102. Also, selector circuit 6 selects which pulse signal is used as the H edge generation clock signal and which pulse signal is used as the L edge generation clock signal. The H edge generation clock signal and the L edge generation clock signal, which are selected in this way, are synthesized in waveform synthesis circuit 7. According to this operation, the clock signal whose the duty ratio is changed from external input signal 1 is output to switching circuit 8.

For example, when selector circuit 6 instructs that the H width be broadened, the pulse signal output from pulse generation circuit 41 and the pulse signal output from pulse generation circuit 52 are waveform-synthesized, and the duty ratio becomes larger, as shown in FIG. 4. Also, when selector circuit 6 instructs that the L width be broadened, the pulse signal output from pulse generation circuit 42 and the pulse signal output from pulse generation circuit 51 are waveform-synthesized, and the duty ratio becomes smaller, as shown in FIG. 4.

Then, switching circuit 8 selects whether external input signal 1 is used, as is, as an internal clock signal, or is used after the duty ratio is changed, in accordance with the test mode signal. In this situation, when test mode signal 101 selects the test mode, the clock signal generated by waveform synthesis circuit 7 is output as an internal clock signal.

Incidentally, in the duty ratio adjustment circuit of the present embodiment, the timing of the rising edge does not vary when the H width is broadened, however, the timing of the rising edge is delayed from the original timing when the H width is narrowed. There are many cases in which the H edge is defined in the specification as the operation of the semiconductor device, and it is a problem that the rising edge is delayed. The measurement method must be changed to solve this problem.

A recent semiconductor device is provided with a DLL (Delay-Locked Loop) circuit, because output is required synchronous with the external clock signal. Since this DLL circuit monitors input waveform to synchronize the output with the input waveform, an accurate deviation of the duty ratio can be measured by using this monitoring function. Then, another signal can be adjusted by using the value as a compensation value. Since it is not difficult to investigate the timing of the output waveform, the effects caused by this problem can be minimized.

Further, it can be also considered that the reason why the DLL does not operate is because the frequency is low or because no DLL is mounted on the device. In these cases, it can be considered that the effects by edge deviation can be ignored because the frequency is low.

The duty ratio adjustment circuit of the present embodiment is arranged in a semiconductor device, and therefore, for example, although the waveform is automatically shaped into the duty ratio of 50%, as in the PLL circuit mounted module, or although a simplified measurement device having no function for changing the duty ratio from 50% is used, the test, at the time when the duty ratio is changed, can be performed. According to this arrangement, test efficiency can be improved and the types of tests can be increased.

Also, since this arrangement is a circuit arrangement that is closed only in the input portion of the device, it can be widely applied to evaluations without restricting the circuit operation of another portion.

In the present embodiment, explanations are given of the case in which the delay amounts of delay circuit 3 are equal in the rising edge and in the tailing edge. The present invention is not limited to this case, a delay circuit may be used so that the delay amount for the rising edge and the delay amount for the tailing edge can be independently set.

Also, the object of the present invention is to change the duty ratio, and selector circuit 6 may select the pulse signal from pulse generation circuit 42 and from pulse signal generation circuit 52 to delay both edges.

While a preferred embodiment of the present invention has been described in specific terms, such description is for illustrative purpose only, and it is to be understood that changes and variations may be made without departing from the spirit or scope of the following claims.

What is claimed is:

1. A semiconductor device comprising: a duty ratio adjustment circuit for adjusting a duty ratio of an input clock signal that is input from the outside and for outputting the input clock signal as an internal clock signal, wherein said duty ratio adjustment circuit comprises: a first one-shot pulse generation circuit for detecting a rising edge of said input clock signal and for outputting a pulse signal; a second one-shot pulse generation circuit for detecting a tailing edge of said input clock signal and for outputting a pulse signal; a delay circuit for delaying said input clock signal by a preset delay time and for outputting said input clock signal; a third one-shot pulse generation circuit for detecting a rising edge of an output signal from said delay circuit and for outputting a pulse signal; a fourth one-shot pulse generation circuit for detecting a tailing edge of the output signal from said delay circuit and for outputting a pulse signal; a selector circuit, upon receipt of instructions that a low level width of said input clock signal be broadened, for outputting the pulse signal output from said third one-shot pulse generation circuit as a high edge generation clock signal and for outputting the pulse signal output from said second one-shot pulse generation circuit as a low edge generation clock signal, and, upon receipt of instructions that a high level width of said input clock signal be broadened, for outputting the pulse signal output from said first one-shot pulse generation circuit as a high edge generation clock signal and for outputting the pulse signal output from said fourth one-shot pulse generation circuit as a low edge generation clock signal; and a waveform synthesis circuit for outputting a signal that changes to a high level between the dining during which the high edge generation signal is output from said selector circuit and the timing during which the low edge generation signal is output from said selector circuit, as an internal clock signal.

2. The semiconductor device according to claim 1, wherein in said delay circuit, a delay amount can be set in accordance with a delay amount adjustment signal from the outside.

3. The semiconductor device according to claim 1, wherein in said delay circuit, a delay amount during rising and a delay amount during tailing, can be independently set in accordance with a delay amount adjustment signal from the outside.

* * * * *

UNITED STATES PATENT AND TRADEMARK OFFICE
CERTIFICATE OF CORRECTION

PATENT NO. : 7,449,931 B2 Page 1 of 1
APPLICATION NO. : 11/465390
DATED : November 11, 2008
INVENTOR(S) : Abe It is certified that error appears in the above-identified patent and that said Letters Patent is hereby corrected as shown below:

Claim 1, Col. 6, line 26, "the dining during" should be --the timing during--.

Signed and Sealed this

Seventh Day of July, 2009

JOHN DOLL
*Acting Director of the United States Patent and Trademark Office*